United States Patent
Kambe et al.

[11] Patent Number: 6,037,703
[45] Date of Patent: Mar. 14, 2000

[54] PRESSURE SENSOR HAVING PIEZOELECTRIC LAYER FORMED BY HYDROTHERMAL SYNTHESIS, AND METHOD OF PRODUCING THE SAME

[75] Inventors: Yumi Kambe, Komaki; Masahisa Isaji, Aichi-ken, both of Japan

[73] Assignee: Tokai Rubber Industries, Ltd., Komaki, Japan

[21] Appl. No.: 09/037,591

[22] Filed: Mar. 9, 1998

[30] Foreign Application Priority Data

Mar. 12, 1997 [JP] Japan ................................ 9-057878

[51] Int. Cl.[7] .................................................. H01L 41/08
[52] U.S. Cl. ........................ 310/338; 310/328; 29/25.35
[58] Field of Search .................... 310/328, 338; 29/29.35

[56] References Cited

U.S. PATENT DOCUMENTS

| | | | |
|---|---|---|---|
| 4,458,173 | 7/1984 | Kaufman et al. ................ | 310/338 |
| 4,709,342 | 11/1987 | Hosoda et al. .................. | 364/558 |
| 4,814,661 | 3/1989 | Ratzlaff et al. .................. | 310/328 |
| 5,510,666 | 4/1996 | Watanabe et al. .............. | 310/328 |
| 5,517,073 | 5/1996 | Ohkuma ......................... | 310/338 |
| 5,537,863 | 7/1996 | Fujiu et al. ...................... | 73/105 |
| 5,788,876 | 8/1998 | Chen ............................ | 252/62.9 PZ |
| 5,825,119 | 10/1998 | Shibata et al. ................. | 310/338 |
| 5,831,371 | 11/1998 | Bishop ........................... | 310/328 |
| 5,852,245 | 12/1998 | Wesling et al. ................. | 310/338 |

FOREIGN PATENT DOCUMENTS

| | | | |
|---|---|---|---|
| 0 363 785 | 4/1990 | European Pat. Off. ....... | G01H 11/08 |
| 51-49369 | of 1976 | Japan ............................. | G06F 3/00 |
| 4342489 | of 1992 | Japan ............................. | G30B 7/10 |
| 5318373 | of 1993 | Japan ............................. | H01L 41/08 |
| 6258153 | of 1994 | Japan ............................. | G01L 1/18 |

OTHER PUBLICATIONS

Patent Abstracts of Japan vol. 097, No. 012, Dec. 25, 1997 & JP 09 217178 A (Tokai Rubber Ind Ltd), Aug. 19, *abstract*.

Katsuhiko Shimomura et al: "Preparation of Lead Zirconate Titanate Thin Film by Hydrothermal Method" Japanese Journal of Applied Physics, vol. 30, No. 9B, Sep. 1, 1991, pp. 2174–2177, XP000269849.

Ohba Y et al: "Analysis of Bending Displacement of Lead Zirconate Titanate Thin Film Synthesized by Hydrothermal Method" Japanese Journal of Applied Physics, vol. 32, No. 9B, Part 01, Sep. 1993, pp. 4095–4098, XP000676200.

*Primary Examiner*—Thomas M. Dougherty
*Attorney, Agent, or Firm*—Frishauf, Holtz, Goodman, Langer & Chick, P.C.

[57] ABSTRACT

A pressure sensor comprising a flexible substrate, and a piezoelectric element for detecting a pressure,. The piezoelectric element includes a piezoelectric layer and an electrode layer which are formed on at least one of the opposite sides of the flexible substrate such that the piezoelectric layer is disposed between the flexible substrate and the electrode layer. The pressure sensor is characterized by the formation of the piezoelectric layer by hydrothermal synthesis or hydrothermal crystallization method.

36 Claims, 4 Drawing Sheets

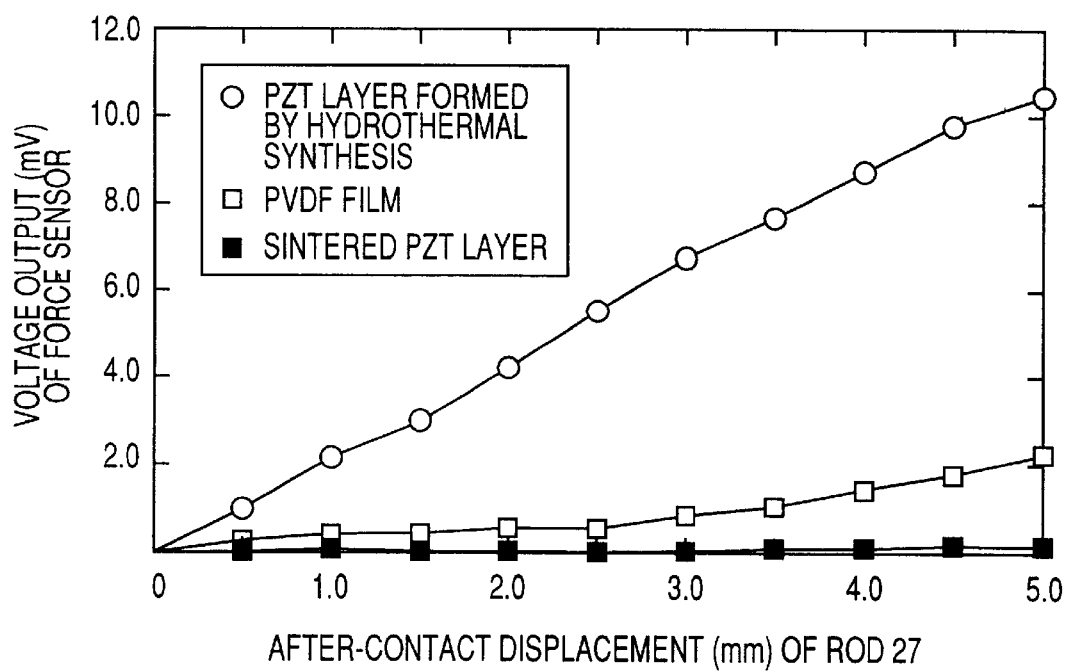

PRESSURE SENSOR HAVING PIEZOELECTRIC LAYER FORMED BY HYDROTHERMAL SYNTHESIS, AND METHOD OF PRODUCING THE SAME

This application is based on Japanese Patent Application No. 9-57878 filed on Mar. 12, 1997, the content of which is incorporated hereinto by reference.

BACKGROUND OF THE INVENTION

1. Field of the Invention

The present invention relates to a pressure sensor and a method of producing the pressure sensor, and more particularly to a pressure sensor including a flexible substrate and a method of producing such a pressure sensor. The pressure sensor according to the present invention can be suitably used, in particular, as a sensing portion of a manipulator, for example.

2. Discussion of the Related Art

Recent progress in the field of "mechatronics" or mechanoelectronics has required pressure sensors or force sensors to have characteristics not provided in the prior art.

For instance, a manipulator such as a robot arm requires a sensor for measuring in a real-time fashion a pressure of contact between the manipulator and an object body, for safe, adequate grasping or holding of the object body. Conventionally, piezoelectric sensors, semiconductor sensors or strain gages have been used as a sensor for such a manipulator.

The conventional pressure or force sensors as described above have a sensing element adapted to receive a pressure or force on a relatively hard flat surface thereof, and tend to suffer from stress concentration at a point of contact between the hard flat surface of the sensing element and the object body, where the object body to be handled has a spherical, oval or otherwise curved surface. Accordingly, the sensing element may mar the surface of the object body or damage the object body, particularly where the object is brittle.

In the light of the above drawback, there have been proposed various pressure sensors which are adapted, to protect the object body, such that the sensing element of the pressure sensor is in indirect surface contact with the object body. For example, the sensing element is covered by a soft or flexible material such as a sponge. Alternatively, a rubber material is bonded to the surface of the sensing element. An example of such pressure sensors is disclosed in JP-A-6-258153. However, these known pressure sensors wherein a force is applied to the sensing element through a flexible or elastic material have the following problems: i) low sensitivity or response to a change in the force or pressure; ii) low linearity of the relationship between the actual force or pressure and the sensor output, due to the use of a flexible or elastic material which generally has a high degree of hysteresis; and iii) inevitable increase in the size (thickness dimension) of the sensor.

There is known a computer system wherein a computer receives information from sensing means including sensors disposed on fingers of an operator's hand so that the motions of the fingers at their joints are detected. The conventional pressure sensors have an insufficient degree of flexibility, causing the operator to feel difficulty in freely moving the fingers or feel the fingers restricted by the pressure sensors.

To solve the problems indicated above, the pressure sensor requires to have a sensing element which is sufficiently flexible. In the light of this requirement, there have been proposed pressure sensors which use a film of a piezoelectric plastic material, more particularly, a PVDF film (polyvinylidene fluoride film) wherein a plastic material exhibits a piezoelectric effect, or a composite piezoelectric plastic film wherein fine particles of a piezoelectric ceramic material are dispersed in a matrix of a plastic material. Examples of such pressure sensors are disclosed in JP-B-51-49396, JP-A-5-318373. Although these pressure sensors have high flexibility, they suffer from relatively low energy conversion efficiency (electromechanical coupling factor), and relatively low heat resistance (highest permissible operating temperature as low as 80° C.).

Thus, there has been a need of providing a pressure sensor which has high flexibility and an improved pressure or force sensing function, permitting accurate detection of a relatively small amount of change in a pressure or force which acts on object bodies of various shapes, like the hands or fingers of human beings.

SUMMARY OF THE INVENTION

As a result of extensive study and research in an effort to solve the conventionally experienced drawbacks and meet the above-indicated need, the present inventors discovered a highly flexible and highly sensitive pressure sensor, which comprises a piezoelectric element including a piezoelectric layer formed by hydrothermal synthesis or hydrothermal crystallization method on a surface of a suitable flexible substrate. The present invention was developed based on this discovery.

According to a first aspect of the present invention, there is provided a pressure sensor, which comprises a flexible substrate, and a piezoelectric element for detecting a pressure, the piezoelectric element including a piezoelectric layer and an electrode layer which are formed on at least one of opposite sides of the flexible substrate such that the piezoelectric layer is disposed between the flexible substrate and the electrode layer, wherein the piezoelectric layer is formed by hydrothermal synthesis.

According to a first preferred form of the present pressure sensor, the flexible substrate consists of a thin sheet, foil or film formed of a metallic or plastic material.

According to a second preferred form of the pressure sensor of the present invention, the flexible substrate is formed of an electrically conductive material and functions as an electrode.

According to a third preferred form of the present pressure sensor, each of at least one of opposite surfaces of the flexible substrate which corresponds to the above-indicated at least one of the opposite sides is coated with a coating layer formed of titanium metal or an alloy or compound thereof.

In one advantageous arrangement of the above third preferred form of the pressure sensor, the flexible substrate is formed of titanium metal or an alloy or compound thereof, and the coating layer is formed of titanium metal or an alloy or compound thereof and functions as an electrode.

According to a fourth preferred form of the present pressure sensor, the piezoelectric layer has a thickness selected within a range between 50 nm and 50 μm.

In one advantageous arrangement of the above fourth preferred form of the pressure sensor, the thickness of the piezoelectric layer is 1 m or larger.

According to a fifth preferred form of the present pressure sensor, the piezoelectric layer consists of a thin film of a piezoelectric composite oxide including titanium, or titanium and lead.

In one advantageous arrangement of the above fifth preferred form of the present, the piezoelectric composite oxide consists of lead zirconate titanate (PZT).

According to a sixth preferred form of the first aspect of the present invention, the pressure sensor further comprises an elastic member to which the piezoelectric element is bonded.

In one advantageous arrangement of the above sixth preferred form of the pressure sensor, the elastic member has a flat surface to which the piezoelectric element is bonded.

In another advantageous arrangement of the above sixth preferred form of the pressure sensor, the elastic member includes a generally convex portion, and the piezoelectric element has a surface which follows a shape of the generally convex portion and at which the piezoelectric element is bonded to the generally convex portion.

In a further advantageous arrangement of the above sixth preferred form of the pressure sensor, the elastic member is formed of a rubber material.

According to a seventh preferred form of the present pressure sensor, the piezoelectric layer and the electrode layer are formed on each of the opposite sides of the flexible substrate.

According to a second aspect of this invention, there is provided a method of producing a pressure sensor comprising a flexible substrate, and a piezoelectric element for detecting a pressure, the piezoelectric element including a piezoelectric layer and an electrode layer which are formed on at least one of opposite sides of the flexible substrate such that the piezoelectric layer is disposed between the flexible substrate and the electrode layer, the present method comprising the step of effecting an operation to form a piezoelectric composition by hydrothermal synthesis for forming the piezoelectric layer on the above-indicated at least one of opposite sides of the flexible substrate.

According to a first preferred form of the second aspect of this invention, the step of effecting an operation to form a piezoelectric composition by hydrothermal synthesis comprises preparing an aqueous solution containing at least one metal salt which gives the piezoelectric composition, immersing the flexible substrate in the aqueous solution within a pressure-tight vessel, and holding the aqueous solution at elevated temperature and pressure.

In one advantageous arrangement of the above first preferred form of the present method, the aqueous solution is an alkaline solution.

In another advantageous arrangement of the above first preferred form of the present method, the elevated temperature is selected within a range of 110–180° C.

In a further advantageous arrangement of the first preferred form of the present method, the elevated pressure is selected within a range of 1.4–10.3 atm.

According to a second preferred form of the method according to the second aspect of this invention, each of at least one of opposite surfaces of the flexible substrate which corresponds to the above-indicated at least one of the opposite sides is coated with a coating layer formed of titanium metal or an alloy or compound thereof.

In one advantageous arrangement of the above second preferred form of the present method, the flexible substrate is formed of titanium metal or an alloy or compound thereof, and the coating layer is formed of titanium metal or an alloy or compound and functions as an electrode.

According to a third preferred form of the present method, the piezoelectric layer consists of a thin film of a piezoelectric composite oxide including titanium, or titanium and lead.

In one advantageous arrangement of the above third preferred form of the present method, the piezoelectric composite oxide consists of lead zirconate titanate (PZT).

According to a fourth preferred form of the present method, the operation to form a piezoelectric composition by hydrothermal synthesis comprises oscillating the pressure-tight vessel at a frequency of not lower than 1 Hz while the flexible substrate is held in the aqueous solution at the elevated temperature and pressure.

According to a fifth preferred form of the present second aspect of this invention, the method further comprises the step of filling a void left in the piezoelectric layer with a selected material.

In one advantageous arrangement of the above fifth preferred form of the present method, the selected material is an electrically insulating material.

In another advantageous arrangement of the above fifth preferred form of the present method, the flexible substrate has a metallic surface on which the piezoelectric layer is formed, and the step of filling a void comprises holding the piezoelectric layer formed by hydrothermal synthesis, in an oxidizing atmosphere, so that areas of the metallic surface exposed through pin holes formed in the piezoelectric layer are coated with an oxide film.

BRIEF DESCRIPTION OF THE DRAWINGS

The above and optional objects, features, advantages and technical and industrial significance of the present invention will be better understood by reading the following detailed description of the invention and description of presently preferred embodiments of the invention, when considered in connection with the accompanying drawings, in which:

FIG. 7 is a graph indicating relationships between the amounts of displacement of piezoelectric elements of a pressure sensor of this invention and comparative pressure sensors and the voltage output of the piezoelectric elements.

Figure 1:
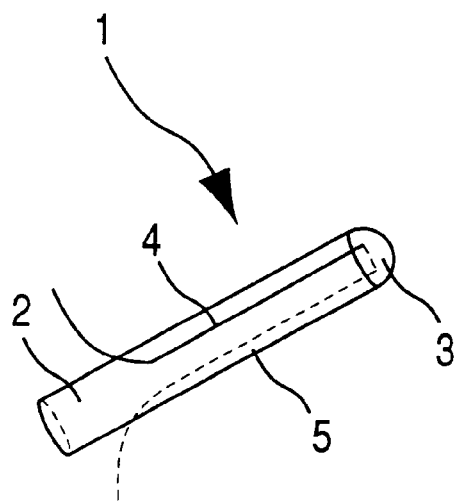
FIG. 1 is a perspective view of a first embodiment of a pressure sensor of the present invention.

DETAILED DESCRIPTION OF THE INVENTION (I) Construction of the Force Sensor

According to the principle of the present invention, a piezoelectric layer is formed by hydrothermal synthesis (hydrothermal crystallization method) on a flexible substrate in the form of a sheet, in particular, on a coating layer formed of titanium metal or an alloy or compound thereof on the sheet-like flexible substrate, and an electrode layer is formed on the piezoelectric layer. The piezoelectric layer and the electrode layer constitute a major portion of pressure sensing means for detecting a pressure or force. A pressure sensor comprising the flexible substrate and the thus formed piezoelectric element is sufficiently flexible and highly sensitive, and may be shaped as desired, depending upon a desired object body having a specific shape or configuration.

The sheet-like flexible substrate used according to the present invention is required to be sufficiently resistant to the elevated temperature and pressure at which the hydrothermal synthesis is effected to form the piezoelectric layer. Typically, the flexible substrate takes the form of a thin sheet, foil or film made of a metallic or heat-resistant plastic material. For example, the metallic material is preferably selected from among stainless steel, iron, aluminum, titanium and lead, and an alloy which contains at least one of those elements. The heat-resistant plastic material is preferably selected from among fluororesins and polyimide resins. For improving adhesiveness between the flexible substrate and the piezoelectric layer formed by hydrothermal synthesis, it is desirable that the flexible substrate is made of titanium metal or an alloy thereof, or is coated at an appropriate surface thereof with a coating layer which is formed of titanium metal or an alloy or compound thereof (e.g., titanium oxide or nitride) by sputtering, deposition, coating or any other suitable method.

The thickness of the thin sheet, foil or film of the flexible substrate is generally selected within a range between about 100 nm and about 500 $\mu$m. The flexible substrate whose thickness is smaller than 100 nm does not have sufficient mechanical strength, and the flexible substrate whose thickness is larger than 500 $\mu$m is not sufficiently flexible.

The piezoelectric layer formed by hydrothermal synthesis and the electrode layer are provided on at least one of the opposite sides of the flexible substrate, so as to provide at least one piezoelectric element. Although a piezoelectric layer is generally formed by sputtering, CVD (chemical vapor deposition) or sol-gel process, these processes have some problems. The sputtering and CVD processes do not assure uniform formation of the piezoelectric layer on a metallic flexible substrate which has a specific shape. Further, the sputtering and CVD processes do not permit easy formation of the piezoelectric layer having a thickness of at least 1 $\mu$m. The sol-gel process requires two or more operations and does not permit easy formation of the piezoelectric layer without defects, where the required thickness of the piezoelectric layer exceeds 1 $\mu$m. Accordingly, the piezoelectric element whose piezoelectric layer is formed by such known methods or processes does not permit accurate detection of a pressure or force. On the other hand, the piezoelectric layer formed by hydrothermal synthesis as described below in detail has a sufficiently dense structure with high stability, even where the thickness exceeds 1 $\mu$m. Accordingly, the piezoelectric element of the pressure sensor according to the principle of this invention permits accurate detection of a pressure or force, with high stability.

The piezoelectric layer used according to the present invention is generally formed of a composite oxide, which permits the piezoelectric layer to be formed by hydrothermal synthesis or hydrothermal crystallization method. For example, such a composite oxide is preferably a perovskite structure ($ABO_3$) comprising at least one site-A element selected from among Pb, Ba, Ca, Sr, La and Bi, for instance, and at least one site-B element which includes at least Ti. A portion of Ti as the site-B element may be replaced or substituted by at least one element selected from among Zr, Zn, Ni, Mg, Co, W, Nb, Sb, Ta and Fe, for example. Examples of the composite oxide include $Pb(Zr, Ti)O_3$, $PbTiO_3$, $BaTiO_3$, $SrTiO_3$, $(Pb, La)(Zr, Ti)O_3$, and a mixture of these composite oxides.

The thickness of the piezoelectric layer of the piezoelectric element used according to the present invention is generally selected within a range of about 50 nm–50 $\mu$m. The piezoelectric layer whose thickness is smaller than 50 nm does not assure sufficiently high sensitivity of the piezoelectric element, while the piezoelectric layer whose thickness exceeds 50 $\mu$m does not have a significant improvement in its characteristics over the piezoelectric layer whose thickness is 50 $\mu$m. While the operation to form a piezoelectric composition by hydrothermal synthesis for forming the piezoelectric layer will be described in detail, it is noted that the piezoelectric layer having a thickness of at least 1 $\mu$m can be advantageously formed by hydrothermal synthesis.

The piezoelectric element is formed by forming the electrode layer by suitable method on the piezoelectric layer which has been formed on the flexible substrate. Generally, the electrode layer is formed of an electrically conductive material such as Al, Ni, Pt, Au, Ag and Cu, generally with a thickness of 1 $\mu$m or smaller, preferably, 0.1 $\mu$m or smaller. For instance, the electrode layer is formed by coating of an electrically conductive paste, electroless plating, sputtering or vapor deposition, and preferably by sputtering.

The piezoelectric element thus formed is provided on at least one of the opposite sides of the flexible substrate such that the piezoelectric layer is disposed between the flexible substrate and the electrode layer. Each piezoelectric element according to the principle of this invention is sufficiently flexible. Upon application of a force such as a tensile or compressive force to the piezoelectric element, there arises a potential difference between the opposite surfaces of the piezoelectric layer which are opposed to each other in the direction in which the force is applied. This potential difference is detected by a pair of electrodes, so that the force applied to the pressure sensor can be obtained from the detected potential difference.

The pair of electrodes includes the electrode layer formed on the piezoelectric layer. Where the flexible substrate is formed of an electrically conductive material such as Ti or an alloy thereof, the flexible substrate functions as the other electrode. Where the electrically conductive flexible substrate is coated with an electrically conductive coating layer, the flexible substrate and the coating layer cooperate to function as the other electrode. Where the flexible substrate is formed of an electrically insulating material, an electrode layer formed on this flexible substrate functions as the other electrode. This electrode layer may be coated with a Ti layer, which is disposed between the piezoelectric layer and the electrode layer formed on the electrically insulating flexible substrate. The piezoelectric layer may be formed on the opposite surfaces of the electrically conductive flexible substrate. In this case, the electrode layer formed on each piezoelectric layer and the flexible substrate constitute a pair of electrodes.

Usually, the pressure sensor according to the present invention comprises a suitable support body member to which the piezoelectric element is bonded so that the piezoelectric element is supported by the supporting body, during use of the sensor. Generally, the support body member is formed of a flexible material, preferably, an elastic material such as silicone rubber, natural rubber, fluororubber (fluoroelastomer), EPDM, SBR or similar rubber materials, and polyurethane. Preferably, the rubber material for the support body member has a hardness value of A20-60, in particular, A30, according to the A hardness, JIS-K-6253 (equivalent to the ISO 7619). In this respect, silicone rubber is particularly preferable as the material of the flexible or elastic support body member.

The piezoelectric element may be bonded to a flat surface or a generally convex surface of an elastic member. Where the pressure sensor according to the present invention is used to detect a force or pressure acting on a manipulator, for example, the piezoelectric element is bonded to a generally convex portion of an elastic support body member in the form of a solid or hollow cylinder, prism, cone, pyramid, rectangular parallelepiped, ellipsoid or sphere. The piezoelectric element bonded to such a generally convex portion of the elastic support body member is capable of detecting a contact with an object body with a high degree of sensitivity. Generally, the piezoelectric element is bonded to the flexible or elastic support body member with a suitable adhesive or bonding agent.

Where the pressure sensor whose piezoelectric element is bonded to a convex portion of an elastic support body member is disposed on a gripping surface of a manipulator, the pressure sensor is elastically deformed so as to have a generally flat or slightly curved shape, due to a force exerted to a surface of the pressure sensor when an appropriate object is grasped by the manipulator. As a result, the originally curved piezoelectric element is bent at the point of contact between the pressure sensor and the object, so as to extend in generally radial directions of a circle having its center at the point of contact. Consequently, there arises a potential difference between the opposite surfaces of the piezoelectric element. It is noted that the amount of deformation of the elastic support body member increases with an increase in the contact pressure between the pressure sensor and the object, so that the contact surface area increases with the contact pressure. Therefore, the present pressure sensor can handle a brittle object, which may be damaged or broken upon grasping by a manipulator provided with the conventional relatively hard pressure sensor.

(II) Formation of Piezoelectric Layer by Hydrothermal Synthesis

The piezoelectric layer of the piezoelectric element of the pressure sensor is formed by hydrothermal synthesis, preferably in the following manner:

(1) Preparation of aqueous solution for piezoelectric composition

Initially, at least one metal salt which gives a piezoelectric composition for the piezoelectric layer is fully or partially dissolved in water, whereby an aqueous solution for the piezoelectric composition is prepared. Each metal salt used is a combination of cations of the metal or metals of the piezoelectric composite oxide and appropriate anions. Generally, inorganic or organic salts of metals which give such metal cations are used. The inorganic metal salts may be selected from among nitrate, sulfate, chloride, hypochlorite, chlorite and chlorate. Examples of the organic metal salts include acetate and oxalate. The concentration of the metal salts is preferably within a range of about 0.05–5.0 mol/l for each compound. If the concentration is lower than 0.05 mol/l, the efficiency of formation of the piezoelectric layer is lowered. If the concentration is higher than 5.0 mol/l, the piezoelectric composition cannot be obtained with uniformity, leading to reduction in the yield ratio of the piezoelectric layer, and uneven properties or thickness of the piezoelectric layer. The pH of the aqueous solution is an important factor, and is determined by the composite oxide. Generally, the aqueous solution is preferably an alkaline solution whose pH is adjusted by sodium hydroxide, ammonium hydroxide, potassium hydroxide, or the like.

(2) Hydrothermal synthesis

Hydrothermal synthesis of the piezoelectric composition is effected within a pressure-tight vessel such as an autoclave in which there have been introduced the above-indicated aqueous solution containing at least one metal salt, and the flexible substrate which may or may not be coated by a suitable coating layer described above. The flexible substrate is kept immersed within a mass of the aqueous solution, while the aqueous solution is held at elevated temperature and pressure. Under the hydrothermal condition at the elevated temperature and pressure, substances that are less likely to be dissolved are relatively easily dissolved in water, with an increase in the reaction rate, whereby the formation or growth of crystals is facilitated and promoted. The piezoelectric layer is formed by hydrothermal synthesis, on only one or both of the opposite surfaces of the flexible substrate. Where the piezoelectric layer is formed on only one of the opposite surfaces of the substrate, the other surface is coated with a suitable resist such as a photoresist. The surface of the substrate on which the piezoelectric layer is formed by hydrothermal synthesis may also be coated with a resist (photoresist) formed in a desired pattern, so that the piezoelectric layer is formed in the corresponding pattern. Where the piezoelectric layers are formed on the respective opposite surfaces of the flexible substrate, two respective electrode layers are formed on the respective two piezoelectric layers, so that the flexible substrate may cooperate with the two electrode layers to provide two pairs of electrodes for producing outputs of the pressure sensor.

Preferably, the photoresist is a mixture of an alkali-resistant rubber such as isoprene rubber and a photosensitive material such as a bis-azide compound. The photoresist applied to the flexible substrate is exposed to light through a mask having a desired pattern, to form a desired photoresist pattern. The photoresist layer or pattern may be replaced by a coating of Au, Pt or other suitable material formed in a desired pattern by sputtering or vapor deposition.

The elevated temperature at which the hydrothermal synthesis is effected depends upon the metal salt or salts used. Generally, the hydrothermal synthesis is effected at an elevated temperature within a range of 110–180° C. Within this temperature range, the crystals of the piezoelectric layer formed by hydrothermal synthesis have highly aligned polarization axes. The pressure within the pressure-tight vessel such as an autoclave is raised by heating the aqueous solution to the desired temperature, and varies with the temperature within the vessel. However, the pressure within the vessel may be positively raised by suitable means. The pressure is preferably held at a pressure within a range of about 1.4–10.3 atm.

The piezoelectric layer formed by hydrothermal synthesis according to the present invention is characterized in that it is automatically polarized during its formation by hydrothermal synthesis. Therefore, the piezoelectric layer does not require subsequent polarization treatment, unless the piezoelectric layer is not subjected to a subsequent treatment at an elevated temperature. The conventionally formed piezoelectric layer requires such subsequent polarization treatment.

The hydrothermal synthesis may be effected in two steps, one for forming crystal cores, and the other for growing the crystals to form the desired piezoelectric layer, as disclosed in JP-A-4-342489.

The aqueous solution containing at least one metal salt as described above, more precisely, the pressure-tight vessel (e.g., autoclave) may be oscillated in the vertical direction (in the direction of gravity) at a suitable frequency, while the flexible substrate and the aqueous solution are held at the predetermined temperature and pressure. The oscillation of the aqueous solution by the oscillation of the pressure vessel permits stable formation of a thin film of the piezoelectric composite oxide, namely, the piezoelectric layer, which has a large surface area and a uniform thickness over the entire area. The frequency of the oscillation is preferably 1 Hz or higher, more preferably, between 3 Hz and 30 Hz. The effect of the oscillation is not sufficient at the frequency lower than 1 Hz, and is saturated at about 30 Hz. At a frequency higher than 30 Hz, gases within the pressure vessel may develop into bubbles which are likely to adhere to the flexible substrate, causing uneven properties and thickness of the piezoelectric layer. For simultaneous heating, pressurization and oscillation of the aqueous solution, an autoclave is supported or carried by a platform or other suitable support means which is vertically movable within an oil bath or electric furnace, so that the autoclave can be vertically oscillated by an electric or pneumatic motor.

(III) Filling of Void Left in Piezoelectric Layer

Before the electrode layer is formed on the piezoelectric layer formed by hydrothermal synthesis, a void which may be left in the piezoelectric layer may be filled with a selected material. For instance, a porous portion of the piezoelectric layer or pin holes left in the piezoelectric layer may be filled with a suitable resin, ceramic material or other electrically insulating material. Where the flexible substrate is formed of a metallic material, or where a surface of the flexible substrate is coated with a metallic coating layer, the piezoelectric layer formed on the metallic substrate surface or metallic coating layer is held in an oxidizing atmosphere at an elevated temperature, so that areas of the metallic surface of the substrate or metallic coating which are exposed through pin holes formed in the piezoelectric layer are coated with a film of an electrically insulating oxide.

Either organic or inorganic materials may be used as the electrically insulating material used to fill the void in the form of the porous portion or pin holes of the piezoelectric layer, or as a precursor of this electrically insulating filler. The filling of the void with the electrically insulating material is effective to improve the sensitivity of the piezoelectric layer.

The organic material as the electrically insulating filler is preferably selected from among vinylchloride, polyethylene, polypropylene, polycarbonate, polyamide, polyimide, epoxy resin, phenol resin, urea resin, acrylic resin, polyacetal, polysulfone, liquid crystal polymer and PEEK (polyether ether ketone).

The inorganic material as the electrically insulating filler is preferably selected from among ceramic coating compositions including at least one major component such as alumina, zirconia, silica and titania, or from among ceramic precursors such as metal alkoxide and polysilazane.

The organic filler material (resin) is applied to the piezoelectric layer, with or without a solvent which is selected depending upon the type of the resin. Where the organic filler material is dissolved in a selected solvent, the solution is applied, by spin coating, spray coating or dipping, to the surfaces of the flexible substrate and the piezoelectric layer, and is then dried or reaction-solidified.

The amount of the organic filler material or resin, which depends upon the type of the resin used, is generally within a range of about 0.004–110 $g/m^2$ (of the substrate surface), and preferably within a range of about 0.09–21 $g/m^2$. If the amount is smaller than 0.004 $g/m^2$, the effect of filling of the void is not sufficient. If the amount is larger than 110 $g/m^2$, a relatively thick filler resin layer formed on the hydrothermally formed piezoelectric layer may have adverse influences such as a reduction of the flexibility of the laminar structure (consisting of the substrate, piezoelectric layer and filler resin layer) and the electrostatic capacity of the piezoelectric layer.

The organic filler material or resin applied is either air-dried, or dried by heating to a temperature lower than the Curie point of the piezoelectric layer, for example, to a temperature within a range of 300–350° C. in the case of the PZT piezoelectric layer (ferroelectric layer).

The inorganic filler material such as ceramic coating material or ceramic precursor is applied to the piezoelectric layer, by coating, spraying or impregnation, and is heated at a temperature lower than the Curie point of the piezoelectric layer (ferroelectric layer), which is generally in a range of about 70–350° C., so that the electrically insulated metal oxide is decomposed and precipitated. The decomposition does not take place in a desired way if the heating temperature is not sufficiently high. Where the piezoelectric layer is a ferroelectric layer, the piezoelectric layer requires subsequent polarization treatment if the heating temperature exceeds the Curie point of the ferroelectric material.

The amount of the inorganic filler material is suitably selected so as to fill the void left in the piezoelectric layer formed by hydrothermal synthesis. Usually, the amount is selected within a range of about 0.2–41 $g/m^2$ (in the solid state).

The oxidizing treatment indicated above is performed where the flexible substrate is formed of a metallic material or where a surface of the substrate on which the piezoelectric layer is formed is coated with a metallic coating layer. To perform this treatment, the metallic substrate or the substrate with the metallic coating layer on which the piezoelectric layer is formed is held in a suitable oxidizing atmosphere, so that the areas of the metallic surface of the substrate or coating layer which areas are exposed through the pin holes in the piezoelectric layer are coated or covered with an electrically insulating oxide film.

The oxidizing treatment can be effected by holding the substrate with or without a metallic coating layer, at an elevated temperature within the oxidizing atmosphere containing oxygen, for instance, within the air.

Alternatively, the oxidizing treatment can be effected within an oxidizing aqueous solution. Where the piezoelectric layer consists of a ferroelectric material, the oxidizing temperature is generally lower than the Curie point of the ferroelectric material.

However, the oxidizing temperature may exceed the Curie point of the ferroelectric material of the piezoelectric layer. In this case, the electrically insulating oxide film having sufficient strength can be formed in a short time, where the oxidizing treatment is effected at a relatively high temperature, which is higher than the Curie point. However, this oxidizing treatment at the high temperature requires subsequent polarization treatment of the piezoelectric layer for intended polarization characteristics of the piezoelectric element. The polarization treatment may be effected at a temperature of about 15–200° C., with a direct current of 1.5–7 kv/mm, for about 20–200 minutes.

The time duration of the oxidizing treatment, which depends upon the oxidizing temperature, is within a range of about 1–8 hours where the oxidizing temperature is not higher than the Curie point, for example, about 200° C. Where the oxidizing temperature is higher than the Curie point, for example, at 500° C., the oxidization treatment is effected for about 1–60 minutes.

The oxidizing treatment is effected by using the oxidizing aqueous solution, the flexible substrate is immersed in the aqueous solution, with a suitable voltage applied between the metallic substrate or metallic coating layer and a reference electrode formed of Ag/AgCl. The aqueous solution may be an aqueous solution of sulfuric acid, nitric acid, hydrochloric acid or acetic acid.

The oxidizing treatment may be followed by an operation to fill the void in the piezoelectric layer with the electrically insulating filler resin described above.

EXAMPLES

There will be described some preferred embodiments of the pressure sensor of the present invention. It is to be understood that the present invention is not limited to the details of these preferred embodiments.

Example 1

Referring first to FIG. 1, there is shown a pressure sensor 1 constructed according to a first embodiment of this invention.

Figure 2:
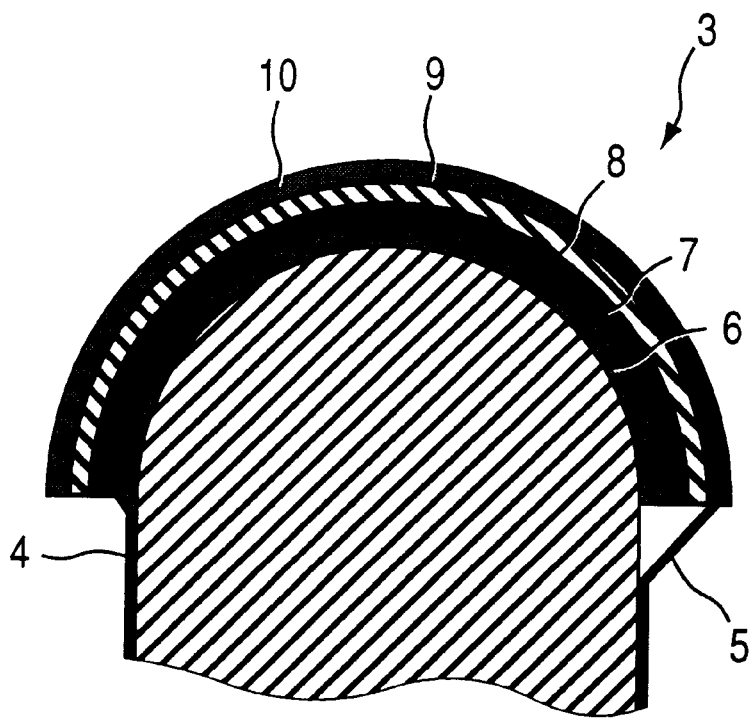
FIG. 2 is a fragmentary enlarged view in cross section of the pressure sensor of FIG. 1.

The pressure sensor 1 includes a support body member in the form of a rod 2 formed of a silicone rubber, a piezoelectric element 3 in the form of a cap, and lead wires 4 and 5. The piezoelectric element 3 is shown in enlargement in the cross sectional view of FIG. 2, which is taken in a plane on which the lead wires 4 and 5 lie. As shown in FIG. 2, the piezoelectric element 3 is a laminar structure consisting of: a PET layer 6 (layer formed of polyethylene terephthalate) formed on a generally convex end portion of the silicone rubber rod 2; a flexible substrate in the form of a titanium foil layer 7 formed on the PET layer 6; a piezoelectric layer 8 formed by hydrothermal synthesis on the titanium foil layer 7; an electrode layer 9 formed on the piezoelectric layer 8; and another PET layer 10 formed on the electrode layer 9. The lead wires 4, 5 are connected to the titanium foil layer 7 and the electrode layer 9, respectively. In this example, the titanium foil layer 7 which functions as the flexible substrate also functions as an electrode which cooperates with the electrode layer 9 to provide a pair of electrodes. The PET layers 6 and 10 protect the end portions of the lead wires 4, 5. The PET layer 6 also functions as an electrically insulating layer, while the PET layer 10 also functions as a protective layer for protecting the electrode layer 9.

When the pressure sensor 1 comes into contact with an object body, at the piezoelectric element 3 at the end of the silicone rubber rod 2, a force or pressure is transmitted or applied to the piezoelectric layer 8 through the PET layer 10 and the electrode layer 9, whereby the portion of the piezoelectric layer 8 which is near the point of contact between the piezoelectric element 3 and the object body is deformed so as to have a certain amount of strain. As a result, a difference of an electric potential takes place between the opposite surfaces of the piezoelectric layer 8, and the potential difference is detected by a suitable detector circuit connected to the lead wires 4, 5. Thus, the force or pressure acting on the pressure sensor 1 (piezoelectric element 3) due to contact with the object body can be detected. The pressure sensor 1 can be produced by the following method:

A titanium foil having a thickness of 20 μm was pressed into a semi-spherical shape following a convex end portion of the silicone rubber rod 2. The inner radius of curvature of the thus formed semi-spherical titanium foil layer 7 was 3 mm. The semi-spherical titanium foil layer 7, which functions as the flexible substrate, was washed and dried, and then immersed in a bath of a photoresist liquid (e.g., OMR-83 available from Tokyo Ohka Kogyo Co. Ltd., Japan), so that the semi-spherical titanium foil was coated with the photoresist. After the photoresist was dried, the photoresist on the inner surface of the semi-spherical titanium foil layer 7 was exposed to a ultraviolet radiation for ten seconds. The titanium foil layer 7 was then subjected to a development treatment with n-heptane, whereby the photoresist was removed from the outer surface of the titanium foil layer 7, while the photoresist remained on the inner surface. Thus, the inner surface of the titanium foil layer 7 was masked by the photoresist.

360 ml of aqueous solution containing 120 mmol of lead (II) nitrate, 57.6 mmol of zirconium oxychloride, 30 mmol of titanium tetrachloride and 1.6 mol of potassium hydroxide was introduced into an internally Teflon-lined pressure-tight vessel. The semi-spherical titanium foil layer 7 as the flexible substrate whose inner surface had been masked by the resist was introduced in the vessel, and the vessel was pressure-tightly closed. The vessel was kept in an oil bath at 150° C. for 48 hours, while it was oscillated as needed. Thus, hydrothermal synthesis was achieved within the vessel.

After the hydrothermal synthesis, the flexible substrate in the form of the semi-spherical titanium foil layer 7 was removed from the vessel, and washed by a ultrasonic cleaner with distilled water. Then, the photoresist was removed from the inner surface of the titanium foil layer 7, with a resist dissolving agent (e.g., 502A available from Tokyo Ohka Kogyo Co. Ltd., Japan), and the titanium foil was sufficiently dried. A specimen of the titanium foil layer 7 as the flexible substrate was cut in a plane parallel to the direction of its thickness. A microscopic inspection of the cut surface of the titanium foil revealed the presence of a piezoelectric layer 8 which is formed on the non-masked outer surface of the semi-spherical titanium foil. The piezoelectric layer 8 has a substantially uniform thickness of about 6 μm and consists of crystals of lead zirconate titanate (PZT).

Then, an electrode layer 9 of platinum (Pt) having a thickness of 10 nm was formed by RF sputtering on the PZT piezoelectric layer.

The semi-spherical laminar structure consisting of the titanium foil layer 7, PZT piezoelectric layer 8 and Pt electrode layer 9 was cut by ceramic scissors, in a plane parallel to the direction of its thickness, and lead wires 4, 5 were connected to the titanium foil layer 7 and the Pt electrode layer 9, respectively. Thus, a semi-spherical piezoelectric element 3 was prepared. The inner and outer surfaces of the piezoelectric element were covered by PET layers 6, 10.

The thus prepared semi-spherical piezoelectric element 3 was fitted on a semi-spherical end portion of a cylindrical rod 2 made of a silicone rubber. The semi-spherical, end portion of the silicone rubber rod 2 has a radius of curvature of 3 mm, which is the same as the radius of curvature of the inner surface of the titanium foil layer 7. The piezoelectric element 3 was bonded by a suitable adhesive to the end portion of the silicone rubber rod 2. Thus, the pressure sensor 1 was produced.

The pressure sensor 1 was fixed to a stationary block such that the end portion of the silicone rubber rod 2 remote from the semi-spherical end portion was fixed in a cylindrical hole formed in the block. A rigid object having a flat surface was forced onto the semi-spherical piezoelectric element 3 at the semi-spherical end portion of the rod 2. The pressure sensor 1 produced a clearly detectable output when the force acting on the piezoelectric element 3 was as small as 0.5 gf. Further, a weight of 10 g was dropped onto the piezoelectric element 3, to check the piezoelectric element 3 for its response. The piezoelectric element 3 produced an output within 0.01 ms after the moment of collision of the weight with the piezoelectric element 3. This indicates a sufficiently high response of the piezoelectric element 3, which permits the pressure sensor 1 to be used on a manipulator so that the manipulator is capable of grasping an object body without an excessively large force acting on the object body.

Example 2

A titanium foil having a thickness of 20 $\mu$m which has been washed by acetone and then dried was coated with a photoresist liquid. Selected rectangular areas of the photoresist liquid coating on one of opposite surfaces of the titanium foil were covered by respective rectangular masks (10 mm×5 mm), and the titanium foil was exposed to a ultraviolet radiation and then subjected to a development treatment with n-heptane, whereby the photoresist was removed from only the masked rectangular areas of the titanium foil which had not been exposed to the ultraviolet radiation.

A PZT piezoelectric layer was formed on each of the rectangular areas of the titanium foil which are not covered by the photoresist. The PZT piezoelectric layers were formed by hydrothermal synthesis in the same way as in Example 1. Then, a mask having rectangular apertures corresponding to the formed PZT piezoelectric layers was placed on the surface of the titanium foil on which the PZT piezoelectric layers were formed. This surface of the titanium foil was subjected to RF sputtering of platinum (Pt), so that rectangular Pt electrode layers each having a thickness of 10 nm were formed on the respective PZT piezoelectric layers.

Figure 3:
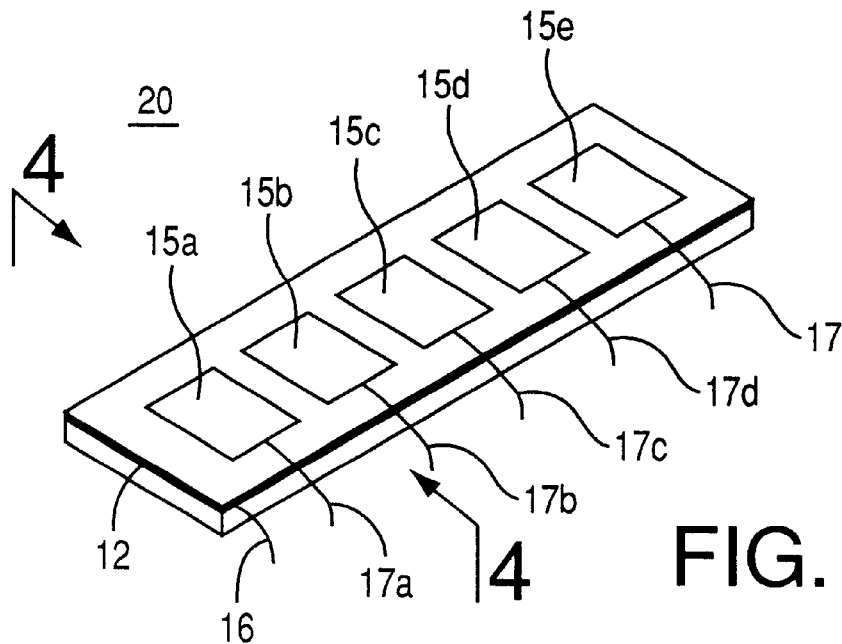
FIG. 3 is a perspective view of a pressure sensor constructed according to a second embodiment of this invention.
Figure 4:
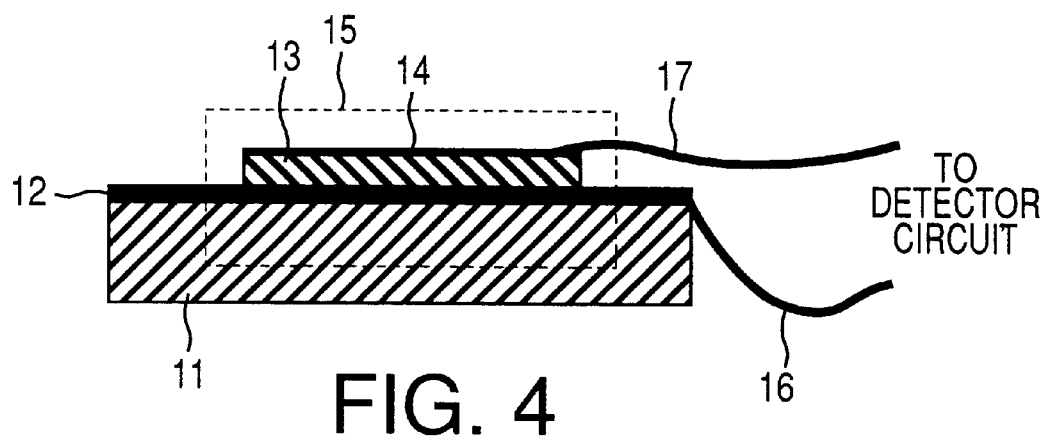
FIG. 4 is a cross sectional view taken along line 4—4 of FIG. 3.

The thus obtained laminar structure consisting of the titanium foil, PZT piezoelectric layers and Pt electrode layers was bonded by an adhesive to a flexible substrate in the form of a silicone rubber sheet having a thickness of 2 mm. Lead wires were soldered to the titanium foil and the Pt electrode layers. Thus, an elongate rectangular pressure sensor 20 as shown in the perspective view of FIG. 3 was produced. This pressure sensor 20 consists of the silicone rubber sheet 11, the titanium foil layer 12, and a plurality of piezoelectric elements 15 (15a through 15e) which are arranged on the titanium foil layer 12 in the longitudinal direction of the layer 12. As indicated by broken line in FIG. 4, each piezoelectric element 15 includes the PZT piezoelectric layer 13, Pt electrode layer 14, and a portion of the titanium foil layer 12 on which the PZT piezoelectric layer 13 is formed. This portion of the titanium foil layer 12 functions as a common electrode which cooperates with the Pt electrode layer 14 to provide a pair of electrodes of the piezoelectric element. A lead wire 16 is connected to the common electrode in the form of the titanium foil layer 12, while lead wires 17 (17a through 17e) are connected to the respective Pt electrode layers 14 of the piezoelectric elements 15a–15e.

Figure 5:
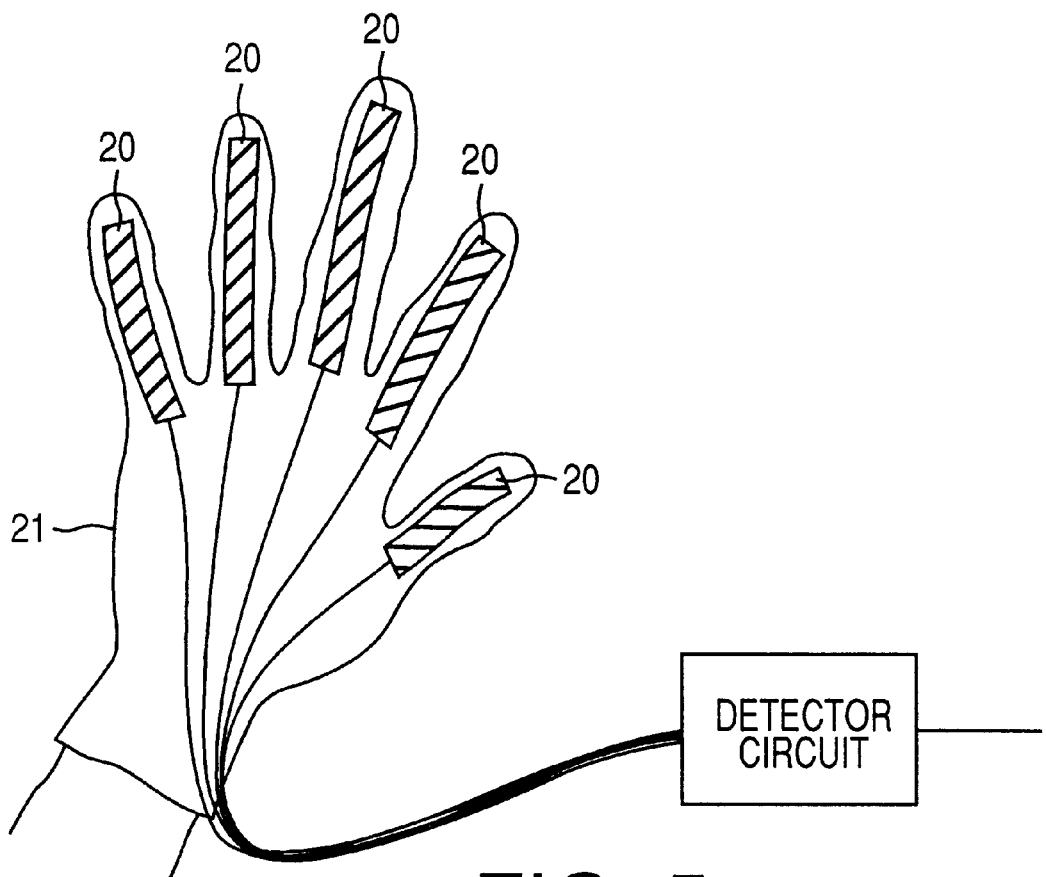
FIG. 5 is a schematic view showing a glove which is equipped with pressure sensors each constructed according to the second embodiment of the invention and which is put on a hand of a robot arm.

The pressure sensor 20 was attached to each of five finger portions of a glove 21 put on a hand of a robot arm, as indicated in FIG. 5, and the lead wires 16, 17 (FIG. 4) were connected to a detector circuit as shown in FIG. 5. A test showed accurate detection of forces acting on the fingers of the robot arm, with high stability and operating response. The test also showed free movements of the fingers at their joints without restrictions by the pressure sensors 20.

Example 3

Figure 6:
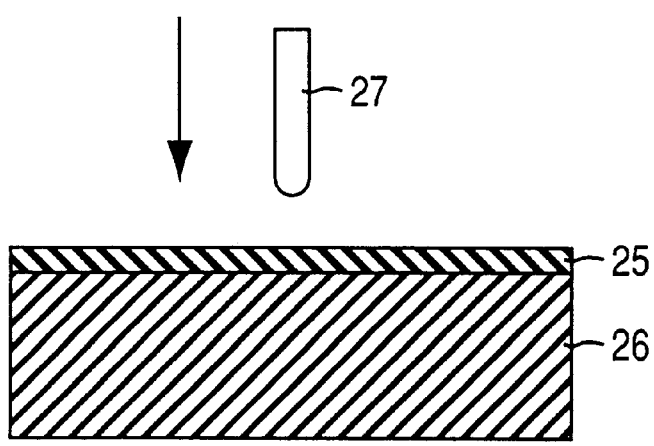
FIG. 6 is a cross sectional view illustrating a method of testing a pressure sensor.

A flexible piezoelectric element 25 as shown in FIG. 6 was prepared by forming a PZT piezoelectric layer on one of opposite surfaces of a titanium foil layer (3 cm×3 cm) and a Pt electrode layer on the PZT piezoelectric layer, in the same manner as in Example 2. Lead wires were connected to the titanium foil layer and the Pt electrode layer, respectively. The piezoelectric element 25 was bonded at its titanium foil layer to a silicone rubber sheet 26 as shown in FIG. 6. The silicone rubber sheet 26 has a hardness value of A30 (A hardness: JIS-K-6253 equivalent to ISO 7619) and a thickness of 10 mm.

The thus produced pressure sensor having the piezoelectric element 25 was placed on a horizontal flat surface, with the silicone rubber sheet 26 in contact with the flat surface. An epoxy resin presser rod 27 having a semi-spherical end portion (with a radius of curvature of 5 mm) was vertically moved down at a rate of 1 mm/sec., so as to press the piezoelectric element 25. Output voltages of the piezoelectric element 25 were measured at different distances of downward displacement or movement of the presser rod 27 after the initial contact with the surface of the piezoelectric element 25. The measured output voltage values in relation to the displacement distance of the presser rod 27 are indicated in the graph of FIG. 7. The graph shows a substantially linear relationship between the output voltage and the displacement distance of the presser rod 27 (namely, the force applied to the piezoelectric element 25). The output voltage was 10.5 mV when the displacement distance of the presser rod 27 was 5 mm.

Comparative Example 1

A flexible piezoelectric element was produced in the same manner as in Example 3, except for the use of a PVDF film in place of the PZT piezoelectric layer formed by hydrothermal synthesis. The PVDF film is a piezoelectric film (3 cm×3 cm; 40 $\mu$m thickness) KF PIEZO commercially available from Kureha Kagaku Kogyou Kabushiki Kaisha, Japan.

A test was conducted on this comparative piezoelectric element, in the same manner as in Example 3. A result of this test is also indicated in FIG. 7. The output voltage was 2.2 mV when the displacement distance of the presser rod 27 was 5 mm.

Comparative Example 2

A flexible piezoelectric element was produced using a sintered PZT piezoelectric layer (3 cm×3 cm; 500 $\mu$m thickness) available from Kabushiki Kaisha Murata Seisakusho, Japan. A test was conducted on this piezoelectric element, in the same manner as in Example 3, except that the presser rod 27 was forced onto the silicone rubber sheet 26 since the sintered PZT layer was not sufficiently flexible. A result of this test is also indicated in FIG. 7. The voltage output was held almost zero while the displacement distance of the presser rod 27 was increased to 5 mm.

Example 4

A titanium layer having a thickness of 0.5 $\mu$m was formed by sputtering on a PEEK (polyether ether ketone) film having a thickness of 50 $\mu$m, and a PZT piezoelectric layer having a thickness of 2 $\mu$m was formed on the titanium layer by hydrothermal synthesis in the same manner as in Example 1. An electrode layer of Ag was formed on the PZT piezoelectric layer, by applying a paste of Ag to the PZT piezoelectric layer. Lead wires were connected to the titanium and Ag electrode layers. Thus, a flexible piezoelectric element was prepared. The piezoelectric element was bonded to a silicone rubber sheet having a thickness of 10 mm and a hardness value of 30°. Thus, a pressure sensor was produced.

A test was conducted on this pressure sensor in the same manner as in Example 3. The voltage output of the piezoelectric element was 7.6 mV when the displacement distance of the presser rod 27 was 5 mm.

Example 5

Two arrays of PZT piezoelectric layers 13 were formed on the respective opposite surfaces of the titanium foil layer 12, by hydrothermal synthesis in the same manner as in Example 1. The PZT piezoelectric layers 13 were formed in the same manner as in Example 2, except that the rectangular masks were used on both of the opposite surfaces of the titanium foil layer 12 before exposure to the ultraviolet radiation and the development treatment. As in Example 2, Pt electrode layers 14 having a thickness of 10 nm were formed by RF sputtering on the respective PZT arrays piezoelectric layers on the opposite surfaces of the titanium foil layer 12. Thus, a pressure sensor having two arrays piezoelectric elements was produced. The titanium foil layer which functions as the flexible substrate also functions as a common electrode which cooperates with the two Pt electrode layers to provide two pairs of electrodes of the respective two piezoelectric elements. A test conducted in the same way as in Example 3 revealed a high sensitivity of this pressure sensor and a substantially linear relationship between the output voltage and the displacement distance of the presser rod 27, as in Example 3.

Example 6

A titanium foil (10 mm×30 mm) having a thickness of 50 $\mu$m and washed with acetone, and 30 ml of an aqueous solution containing materials for a piezoelectric composition were introduced into an internally Teflon-lined autoclave having a diameter of 7 cm. The aqueous solution contained 10.00 mmol of $Pb(NO_3)_2$, 4.8 mmol of $ZrOCl_2$ and 136.8 mmol of KOH. The autoclave was immersed in a bath of silicone oil, and held at 150° C. for 48 hours while being oscillated to stir the aqueous solution within the autoclave.

The titanium foil was removed from the autoclave, washed by a ultrasonic cleaner with distilled water, and then sufficiently dried. A microscopic inspection of the titanium foil revealed the presence of a porous PZT piezoelectric layer of about 10 $\mu$m formed on the surface of the titanium foil by hydrothermal synthesis.

A solution in which a nylon resin called "diamide X1874" available from Daicel-Huls Kabushiki Kaisha, Japan is dissolved at 50° C. in a solvent whose volume is five times as large as that of the nylon resin was applied by spin coating method, uniformly to the surface of the titanium foil on which the PZT piezoelectric layer was formed. The titanium foil with the PZT piezoelectric layer was air-dried at 80° C. for 30 minutes, and cut in a plane parallel to the direction of its thickness. An inspection of the cut surface revealed that the pores in the porous structure of the PZT piezoelectric layer were filled with the nylon resin, without an influence on the properties of the PZT layer.

A Pt electrode layer was formed by RF sputtering on the PZT piezoelectric layer, using an ion sputtering device. The thus prepared piezoelectric element was cut at an end portion thereof by ceramic scissors, and the insulation resistance between the Pt electrode layer and the titanium foil was measured ten times. An average of the measured ten insulation resistance values was 9.2 M$\Omega$, and the standard deviation of the insulation resistance was 0.85 M$\Omega$.

Example 7

A PZT piezoelectric layer was formed by hydrothermal synthesis on a titanium foil, in the same manner as in Example 6, and was held in the atmosphere at 250° for five hours, so that the areas of the surface of the titanium foil which were exposed through pin holes in the porous PZT piezoelectric layer were coated by an oxide film. A Pt electrode layer was formed by RF sputtering on the PZT piezoelectric layer, and the insulation resistance between the titanium foil and the Pt electrode layer was measured ten times. An average of the measured ten insulation resistance values was 6.1 M$\Omega$, and the standard deviation was 0.51 M$\Omega$.

Example 8

A PZT piezoelectric layer was formed. by hydrothermal synthesis on a titanium foil, in the same manner as in Example 6, and was held in the atmosphere within a furnace at 500° for 10 minutes, so that the areas of the surface of the titanium foil which were exposed through pin holes in the porous PZT piezoelectric layer were coated by an oxide film. A Pt electrode layer was formed by RF sputtering on the PZT piezoelectric layer. The thus prepared piezoelectric element was held in a bath of silicone oil at 120°C., with a direct current of 3 kV/mm being applied between the Pt electrode layer and the titanium foil, so that the PZT piezoelectric layer was polarized.

The insulation resistance between the titanium foil and the Pt electrode layer was measured ten times. An average of the measured ten insulation resistance values was 6.2 M$\Omega$, and the standard deviation was 0.49 M$\Omega$.

Example 9

A PZT piezoelectric layer was formed by hydrothermal synthesis on a titanium foil, in the same manner as in Example 6, and was immersed in 0.5 M of $H_2SO_4$ solution at 30° C. A reference electrode of Ag/AgCl was connected to the PZT piezoelectric layer, and 1.5 V was kept applied between the reference electrode and the titanium foil, so that the areas of the surface of the titanium foil which were exposed through pin holes in the porous PZT piezoelectric layer were coated with an oxide film.

A Pt electrode layer was formed on the PZT piezoelectric layer, and the insulation resistance between the Pt electrode layer and the titanium foil was measured ten times. An average of the measured ten insulation resistance values was 5.8 M$\Omega$, and the standard deviation was 0.53 M$\Omega$.

A piezoelectric element was produced in the same manner as in Example 6, except in that the pores in the porous structure of the PZT piezoelectric layer were not filled with the nylon resin.

The insulation resistance between the Pt electrode and the titanium foil was measured ten times. An average of the measured ten insulation resistance values was 4.4 M$\Omega$, and the standard deviation of the insulation resistance was 1,241 M$\Omega$. It will be understood that the filling of the void in the PZT piezoelectric layer or the coating of the exposed surface areas of the titanium foil improves the insulation resistance and its stability.

Example 10

A titanium foil (50 mm×50 mm) having a thickness of 50 $\mu$m and washed with acetone, and 360 l of an aqueous solution containing materials for a piezoelectric composition were introduced into an internally Teflon-lined autoclave having a diameter of 7 cm. The aqueous solution contained 120 mmol of $Pb(NO_3)_2$, 58.3 mmol of $ZrOCl_2$ and 1642 mmol of KOH. In the meantime, a silicon oil was introduced into a stainless steel vessel which is equipped with a vertically movable platform. The autoclave was mounted on the movable platform within the vessel, and the vessel was pressure-tightly closed. The autoclave was held at 150° C. within the vessel for 48 hours, while the autoclave was kept oscillated in the direction of gravity at a frequency of 3 Hz or higher.

The titanium foil was removed from the autoclave, washed by a ultrasonic cleaner with distilled water. A piezoelectric layer consisting of uniform crystals of PZT (lead zirconate titanate) or PZ (lead zirconate) was found to have been formed on the titanium foil. The titanium foil with the PZT or PZ piezoelectric layer was again introduced into the autoclave, together with 360 ml of aqueous solution containing 119 mmol of $Pb(NO_3)_2$, 51.4 mmol of $ZrOCl_2$, 53.9 mmol of $TiCl_4$ and 787.2 mmol of KOH. The autoclave was held at 120° C. for 48 hours, while the autoclave was kept oscillated in the direction of gravity at a frequency of 3 Hz or higher.

The titanium foil was removed from the autoclave, washed by a ultrasonic cleaner with distilled water, and then sufficiently dried. A microscopic inspection of the titanium foil revealed uniform formation of PZT crystals on the surface of the titanium foil by hydrothermal synthesis.

A solution in which polysilazane PHPS-2 available from Tohnen Kabushiki Kaisha, Japan is dissolved in xylene whose volume is about five times as large as that of polysilazane was applied by spin coating method, uniformly to the PZT piezoelectric layer formed on the titanium foil. The titanium foil with the PZT piezoelectric layer was air-dried at 80° C. for one hour.

To check the PZT piezoelectric layer for the presence of pin holes, a current leakage test was conducted on the piezoelectric element, using an aqueous solution of NaCl. Described more specifically, a DC voltage of 10 V was kept applied for 30 seconds between the titanium foil and the Pt electrode layer, and the leak current was measured by an ammeter ten times. An average of the measured ten leak current values was $0.002$ $mA/cm^2$, and the standard deviation of the leak current was $0.0015$ $mA/cm^2$.

A piezoelectric element was produced in the same manner as in Example 10, except in that the solution of polysilazane was not applied to fill the pores in the PZT piezoelectric layer. The leak current was measured ten times. An average of the measured ten leak current values was $8.5$ $mA/cm^2$, and the standard deviation was $2.1$ $mA/cm^2$.

It will be understood that the filling of the pores in the PZT piezoelectric layer in Example 10 also improves the insulation resistance and its stability.

While the presently preferred examples of the pressure sensor of the present invention have been described in detail by reference to the accompanying drawings, it is to be understood that the invention may be otherwise embodied, with various changes, improvements and modifications, which may occur to those skilled in the art, without departing from the spirit and scope of the invention defined in the following claims:

What is claimed is:

1. A pressure sensor comprising a flexible substrate, and a piezoelectric element for detecting a pressure, said piezoelectric element including a piezoelectric layer and an electrode layer which are formed on at least one of opposite sides of said flexible substrate such that said piezoelectric layer is disposed between said flexible substrate and said electrode layer, wherein said piezoelectric layer is formed by hydrothermal synthesis, and said piezoelectric layer includes a porous portion having a void which is filled with an electrically insulating material.

2. A pressure sensor according to claim 1, wherein said flexible substrate consists of a thin sheet, foil or film formed of a metallic or plastic material.

3. A pressure sensor according to claim 1, wherein said flexible substrate is formed of an electrically conductive material and functions as an electrode.

4. A pressure sensor according to claim 1, wherein each of at least one of opposite surfaces of said flexible substrate which corresponds to said at least one of said opposite sides is coated with a coating layer formed of titanium metal or an alloy or compound thereof.

5. A pressure sensor according to claim 4, wherein said flexible substrate is formed of titanium metal or an alloy or compound thereof, and said coating layer is formed of titanium metal or an alloy or compound thereof and functions as an electrode.

6. A pressure sensor according to claim 1, wherein said piezoelectric layer has a thickness between 50 nm and 50 $\mu$m.

7. A pressure sensor according to claim 6, wherein said thickness of said piezoelectric layer is at least 1 $\mu$m.

8. A pressure sensor according to claim 1, wherein said piezoelectric layer consists of a thin film of a piezoelectric composite oxide including titanium, or titanium and lead.

9. A pressure sensor according to claim 8, wherein said piezoelectric composite oxide consists of lead zirconate titanate (PZT).

10. A pressure sensor according to claim 1, further comprising an elastic member to which said piezoelectric element is bonded.

11. A pressure sensor according to claim 10, wherein said elastic member has a flat surface to which said piezoelectric element is bonded.

12. A pressure sensor according to claim 10, wherein said elastic member includes a generally convex portion, and said piezoelectric element has a surface which follows a shape of said generally convex portion and thereat said piezoelectric element is bonded to said generally convex portion.

13. A pressure sensor according to claim 10, wherein said elastic member is formed of a rubber material.

14. A pressure sensor according to claim 1, wherein said piezoelectric layer and said electrode layer are formed on each of said opposite sides of said flexible substrate to provide two piezoelectric elements, said flexible substrate being formed of an electrically conductive material and functioning as a common electrode which cooperates with the two electrode layers on said opposite sides of said flexible substrate to serve as two pairs of electrodes for said two piezoelectric elements, respectively.

15. A method of producing a pressure sensor according to claim 1 comprising a flexible substrate, and a piezoelectric element for detecting a pressure, said piezoelectric element including a piezoelectric layer and an electrode layer which are formed on at least one of opposite sides of said flexible substrate such that said piezoelectric layer is disposed between said flexible substrate and said electrode layer, said method comprising the steps of:

(a) effecting an operation to form a piezoelectric composition by hydrothermal synthesis for forming said piezoelectric layer on said at least one of opposite sides of said flexible substrate, said piezoelectric layer including a porous portion having a void; and (b) filling said void with an electricity insulating material.

16. A method according to claim 15, wherein said step of effecting an operation to form a piezoelectric composition by hydrothermal synthesis comprises preparing an aqueous solution containing at least one metal salt which gives said piezoelectric composition, immersing said flexible substrate in said aqueous solution within a pressure-tight vessel, and holding said aqueous solution at an elevated temperature and an elevated pressure.

17. A method according to claim 16, wherein said aqueous solution is an alkaline solution.

18. A method according to claim 16, wherein said elevated temperature is within a range of 110 to 180° C.

19. A method according to claim 16, wherein said elevated pressure is within a range of 1.4 to 10.3 atm.

20. A method according to claim 15, wherein each of at least one of opposite surfaces of said flexible substrate which corresponds to said at least one of said opposite sides is coated with a coating layer formed of titanium metal or an alloy or compound thereof.

21. A method according to claim 20, wherein said flexible substrate is formed of titanium metal or an alloy or compound thereof, and said coating layer is formed of titanium metal or an alloy or compound and functions as an electrode.

22. A method according to claim 15, wherein said piezoelectric layer consists of a thin film of a piezoelectric composite oxide including titanium, or titanium and lead.

23. A method according to claim 22, wherein said piezoelectric composite oxide consists of lead zirconate titanate (PZT).

24. A method according to claim 15, wherein said operation to form a piezoelectric composition by hydrothermal synthesis comprises oscillating said pressure-tight vessel at a frequency of not lower than 1 Hz while said flexible substrate is held in said aqueous solution at said elevated temperature and said elevated pressure.

25. A method according to claim 15, wherein said electrically insulating material is an inorganic material which is a ceramic coating composition which includes at least one component selected from the group consisting of alumina, zirconia, silica and titania.

26. A method according to claim 25, wherein said step of filling said void comprises applying said inorganic material to said porous portion of said piezoelectric layer by coating, spraying or impregnation, and heating the applied inorganic material to a temperature lower than a Curie point of said piezoelectric layer.

27. A method according to claim 15, wherein said flexible substrate has a metallic surface on which said piezoelectric layer is formed, and said step of filling a void comprises holding said piezoelectric layer formed by hydrothermal synthesis, in an oxidizing atmosphere, so that areas of said metallic surface exposed through pin holes formed in said piezoelectric layer are coated with an oxide film.

28. A pressure sensor according to claim 1, wherein said flexible substrate has a metallic surface on which said piezoelectric layer is formed, said metallic surface including areas through which pin holes as said void of said porous portion of said piezoelectric layer are open, said areas being coated with a film of an electrically insulating oxide as said electrically insulating material.

29. A pressure sensor according to claim 1, wherein said electrically insulating material is an organic material selected from the group consisting of vinylchloride, polyethylene, polypropylene, polycarbonate, polyamide, polyimide, epoxy resin, phenol resin, urea resin, acrylic resin, polyacetal, polysulfone, liquid crystal polymer and polyether ether ketone.

30. A pressure sensor according to claim 1, wherein said electrically insulating material is an inorganic material which is a ceramic coating composition which includes at least one component selected from the group consisting of alumina, zirconia, silica and titania.

31. A pressure sensor according to claim 1, wherein said electrically insulating material is an inorganic material which is a ceramic precursor.

32. A method according to claim 15, wherein said electrically insulating material is an organic material selected from the group consisting of vinylchloride, polyethylene, polypropylene, polycarbonate, polyamide, polyimide, epoxy resin, phenol resin, urea resin, acrylic resin, polyacetal, polysulfone, liquid crystal polymer and polyether ether ketone.

33. A method according to claim 15, wherein said electrically insulating material is an inorganic material which is a ceramic precursor.

34. A method according to claim 32, wherein said step of filling said void comprises applying said organic material to said porous portion of said piezoelectric layer by spin coating, spray coating or dipping.

35. A method according to claim 34, further comprising a step of air-drying said organic material applied to said porous portion of said piezoelectric layer.

36. A method according to claim 34, further comprising a step of drying said organic material applied to said porous portion of said piezoelectric layer by heating said organic material to a temperature lower than a Curie point of said piezoelectric layer.

* * * * *